United States Patent
Barter et al.

(10) Patent No.: US 12,021,038 B2
(45) Date of Patent: Jun. 25, 2024

(54) SOLDERABLE AND WIRE BONDABLE PART MARKING

(71) Applicant: MACOM Technology Solutions Holdings, Inc., Lowell, MA (US)

(72) Inventors: Margaret Barter, Lowell, MA (US); Timothy Boles, Lowell, MA (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 52 days.

(21) Appl. No.: 17/345,086

(22) Filed: Jun. 11, 2021

(65) Prior Publication Data

US 2022/0399280 A1 Dec. 15, 2022

(51) Int. Cl.
*H01L 23/544* (2006.01)
*H01L 21/48* (2006.01)
*H01L 21/67* (2006.01)
*H01L 23/488* (2006.01)

(52) U.S. Cl.
CPC ........ *H01L 23/544* (2013.01); *H01L 21/4814* (2013.01); *H01L 21/67282* (2013.01); *H01L 23/488* (2013.01); *H01L 2223/54406* (2013.01); *H01L 2223/5442* (2013.01); *H01L 2223/54433* (2013.01)

(58) Field of Classification Search
CPC ............... H01L 23/544; H01L 21/4814; H01L 21/67282
USPC ....................................................... 257/798
See application file for complete search history.

(56) References Cited

U.S. PATENT DOCUMENTS

| | | | |
|---|---|---|---|
| 6,194,777 B1 | 2/2001 | Abbott et al. | |
| 6,876,067 B2 | 4/2005 | Arai et al. | |
| 7,189,317 B2 | 3/2007 | Sandhu et al. | |
| 7,285,894 B1* | 10/2007 | da Cunha | H03H 9/14547 |
| | | | 310/313 D |
| 7,521,252 B2 | 4/2009 | Carpenter et al. | |
| 7,887,713 B2 | 2/2011 | Hesse | |
| 8,980,743 B2 | 3/2015 | Burgess et al. | |
| 2006/0006510 A1 | 1/2006 | Koduri | |
| 2014/0167272 A1 | 6/2014 | Martens et al. | |
| 2020/0335451 A1 | 10/2020 | Dangelmaier et al. | |
| 2021/0140932 A1* | 5/2021 | Hegmann | G02F 1/133711 |

(Continued)

FOREIGN PATENT DOCUMENTS

CN 103872020 A 6/2014

OTHER PUBLICATIONS

International Search Report & Written Opinion for PCT Application Serial No. PCT/US2022/031011, dated Sep. 2, 2022, 18 pages.

(Continued)

*Primary Examiner* — Quoc D Hoang
(74) *Attorney, Agent, or Firm* — Sheridan Ross, PC (57) ABSTRACT

A technique for marking semiconductor devices with an identifiable mark or alphanumeric text yields a high-contrast, easily distinguishable mark on an electrical terminal of the device without impacting the device's breakdown voltage capability and without compromising the solderability and wire bondability of the terminal. This approach deposits the mark on the terminal as a patterned layer of palladium, which offers good contrast with the base metal of the terminal and maintains the solderability and bondability of the terminal.

20 Claims, 6 Drawing Sheets

(56) References Cited

U.S. PATENT DOCUMENTS

2021/0401046 A1* 12/2021 Yamada ............... A24F 40/44

OTHER PUBLICATIONS

International Search Report for International Application No. PCT/US2022/031011, dated Sep. 2, 2022.
Written Opinion for International Application No. PCT/US2022/031011, dated Sep. 2, 2022.
International Preliminary Report on Patentability for International Application No. PCT/US2022/031011, dated Dec. 21, 2023.
First Office Action (Including Translation) for Taiwan Patent Application No. 111121424, dated Jan. 3, 2024.

* cited by examiner

SOLDERABLE AND WIRE BONDABLE PART MARKING

TECHNICAL FIELD

The subject disclosure relates generally to semiconductor devices and, in particular, to semiconductor fabrication techniques.

BACKGROUND

It is often beneficial to mark semiconductor devices with symbolic or alphanumeric information that uniquely identifies the device or conveys other information about the device. However, marking semiconductor devices becomes increasingly challenging as these devices continue to reduce in size. Moreover, such markings can add to or change the parasitic capacitances, parasitic inductances, or dielectric stack-ups surrounding the active junctions. Consequently, these markings can interfere with or modify the device's construction, subsequent assembly constraints, or electrical operation, especially at high frequencies and high voltages.

The above-described description is merely intended to provide a contextual overview of semiconductor marking and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, a semiconductor device is provided, comprising a terminal comprising a metal pad; and a patterned layer of palladium deposited on the terminal, wherein the patterned layer forms a mark on the terminal.

Also, according to one or more embodiments, a semiconductor device is provided, comprising an electrical contact formed by a first metallization process and comprising a mark formed by a layer of palladium deposited on the electrical terminal by a second metallization process.

Also, according to one or more embodiments, a method for marking a semiconductor device is provided, comprising performing a first metallization process on a semiconductor device in production that yields at least one electrical terminal on the semiconductor device; and performing a second metallization process that deposits a palladium mark on an electrical terminal of the at least one electrical terminal.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Figure 1:
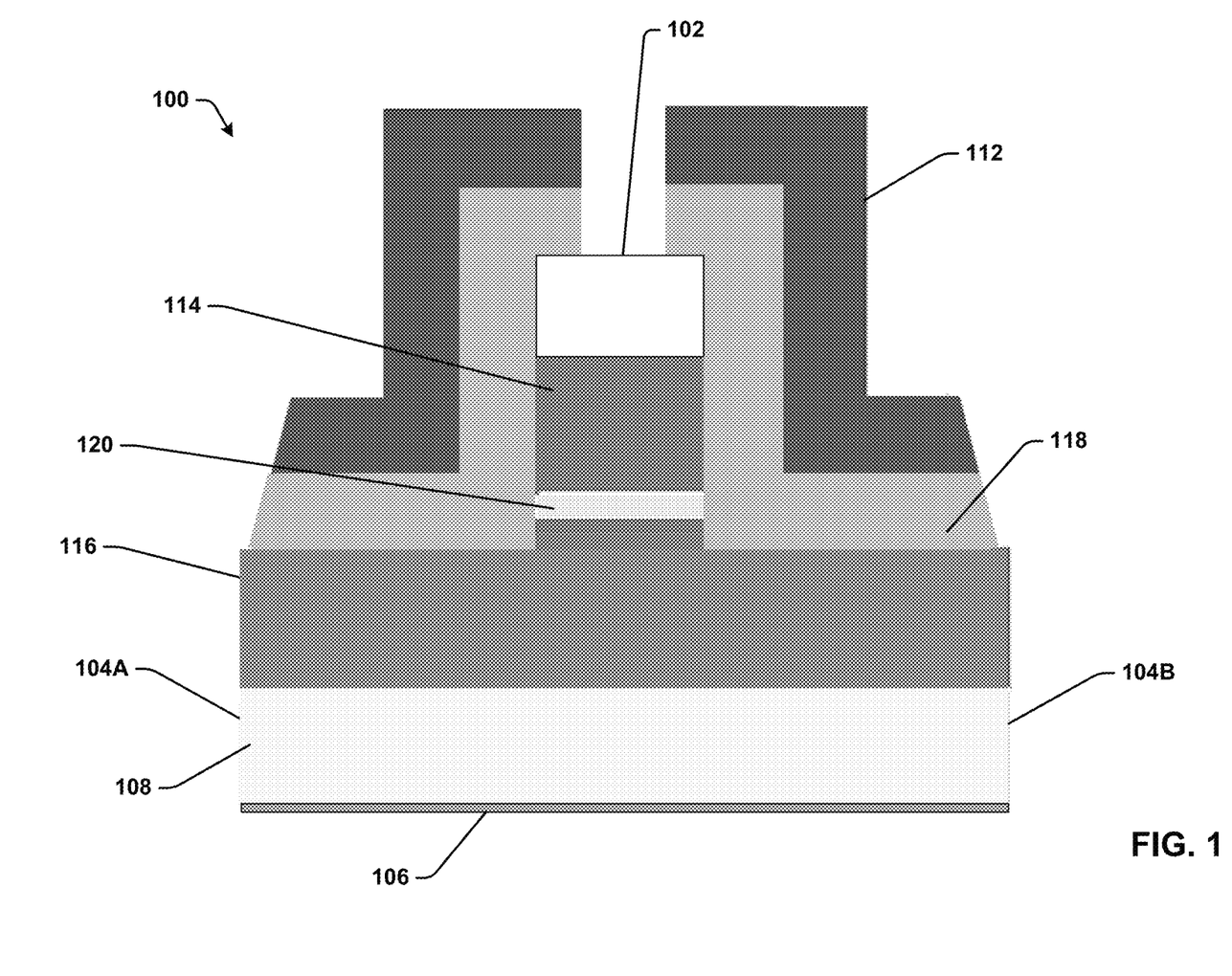
FIG. 1 is a cross-sectional view of an example semiconductor device.

FIG. 1 is a cross-sectional view of an example semiconductor device 100. Although the semiconductor device 100 is depicted as a multi-kilovolt capacitor in FIG. 1, it is to be appreciated that the marking techniques described herein are applicable to substantially any type of passive or active semiconductor device, including but not limited to diodes, transistors (e.g., bipolar junction transistors, field-effect transistors, heterojunction bipolar transistors, insulated gate bipolar transistors, etc.), thyristors, resistors, inductors, filters, or other such devices. In this example, semiconductor device 100 comprises a layer of silicon substrate 108 that serves as the bottom terminal of a device, on which is formed a layer of backside metallization 106. One or more dielectric layers 116 (e.g., silicon dioxide, silicon nitride, etc.) are deposited on the top surface of the silicon substrate 108. Layers of low temperature oxide 120 and doped polysilicon 114 are deposited over the dielectric layer(s) 116. A top metal layer 102 serving as the top device terminal is formed on the doped polysilicon 114, yielding a metal pad on which wires or other conductors can be bonded. A silicon nitride layer 118 and a benzocyclobutene (BCB) layer 112 are deposited around the top metal layer 102. As noted above, this design and type of semiconductor device is only intended to be exemplary, and the marking techniques described herein are not to be construed as being limited to the semiconductor device design or type illustrated in FIG. 1.

It may be beneficial in some cases to mark a semiconductor device with alphanumeric information or other symbology to uniquely identify the device (or the type of the device) or to provide other information about the device. Some types of active semiconductor devices can be marked by etching letters or numbers into a dielectric layout outside the field of interest. However, some devices, such as capacitors with high voltage breakdowns, have no dielectrics outside the field of interest that could be marked in this manner without compromising the device's high voltage breakdown capacity.

As an alternative, the marking can be applied to an electrical terminal of the semiconductor device; e.g., the surface of the top metal layer 102 in the example depicted in FIG. 1. According to an example approach, portions of the electrical terminal can be removed to change the terminal's shape in identifiable ways, such as by chamfering the corners or by forming distinctive terminal shapes (e.g., rectangles, squares, hexagons, octagons, circles, etc.). According to another approach, material can be removed from the terminal to produce holes arranged in a unique or recognizable configuration. However, approaches that rely on removal of material from the device's electrical terminal can compromise the electrical behavior of the terminal by altering the parasitic capacitances or inductances. The terminal's mechanical behavior can also be impacted by these approaches, since removing portions of the terminal can weaken the terminal's solderability or ability to bond to wires.

Figure 2:
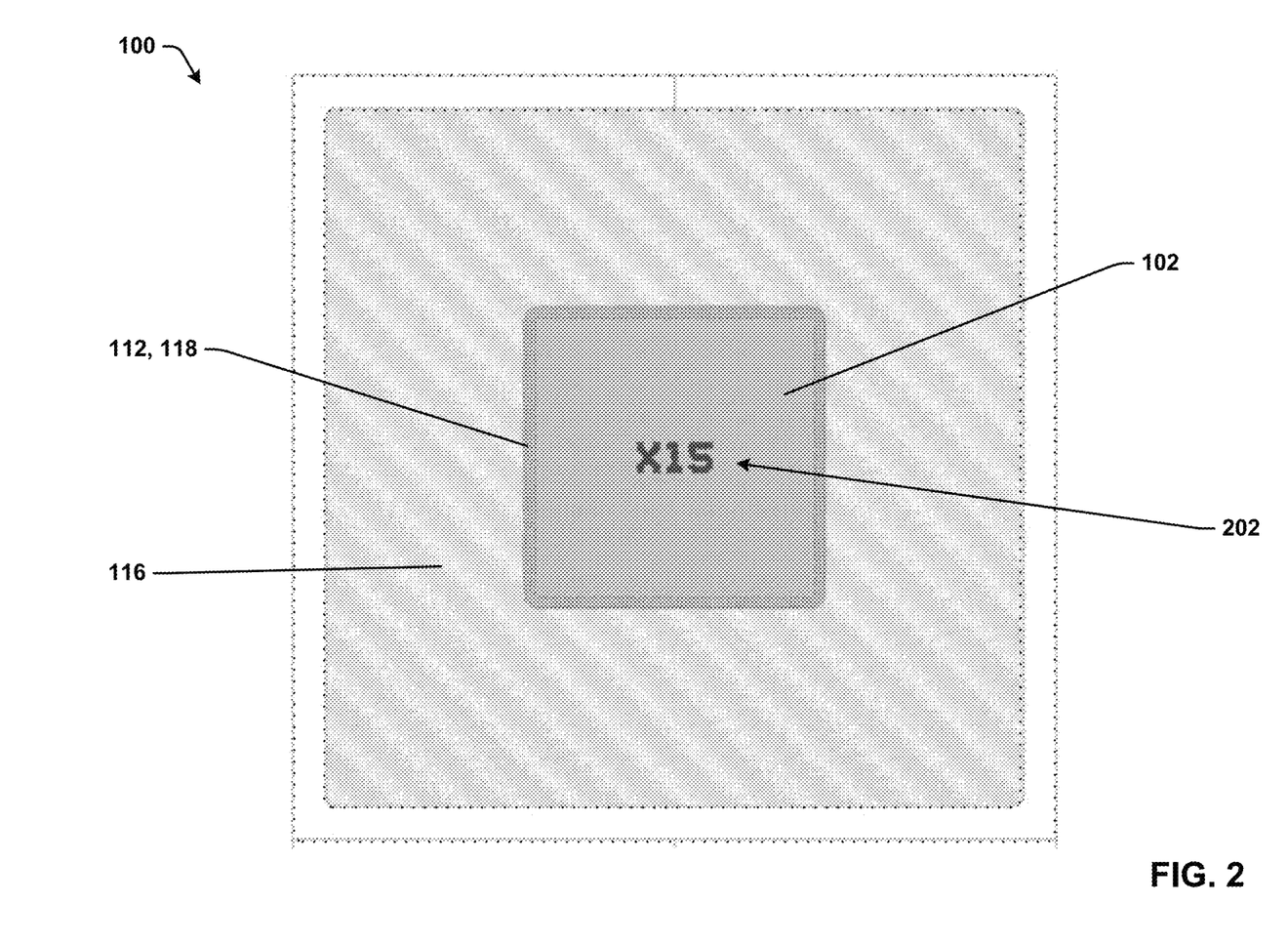
FIG. 2 is a top view of the example semiconductor device depicting an example alphanumeric marking formed on the metal pad of the top metal layer.

To mark the semiconductor device in a manner that does not destroy the intrinsic capacitance and breakdown voltage capability, a high-contrast mark could instead be deposited on the electrical terminal as an additional metal layer. FIG. 2 is a top view of the example semiconductor device 100 depicting an example alphanumeric marking 202 formed on the metal pad of the top metal layer 202. For high frequency, high voltage devices 100, gold may be used as the top metal layer 202 to ensure reliable terminal connections to active devices. Accordingly, examples described herein assume that gold is used as the metal layer 202. However, the marking techniques described herein can be applied to electrical terminals made of other materials, including but not limited to copper, silver, or aluminum.

Ideally, marking 202 should offer a high contrast relative to the gold metallization of the electrical terminal while also maintaining the solderability and wire bondability of the terminal's original gold surface. To apply such a marking 202 without removing portions of the terminal itself, one or more embodiments of the semiconductor device fabrication process described herein can apply the marking 202 as an additional metal layer applied to the top metal layer 202. This additional metal layer can comprise a metal material that provides a significant optical contrast to the base metallization that is employed for the final metallic electrical terminal while adding little or no parasitic capacitance or parasitic inductance. The additional metal layer also should not change the device isolating dielectric design and should not compromise mechanical aspects of the terminal in terms of solderability, wire bondability, or other subsequent assembly requirements.

Based on much experimentation with these criteria in mind, the inventors have concluded that palladium metallization satisfies these requirements. In particular, this experimentation has confirmed the ability to solder and wire bond to a gold electrical terminal having a marking 202 formed by applying an additional layer of palladium. The gold terminal marked with a layer of palladium was also observed to have good solder wettability with no peeling or delamination of the solder joint. Die sheer tests revealed that the resulting solder joint was stronger than the semiconductor material itself. Tests using wire and ribbon bonds were performed at loads ranging from 3.1996 gram-force to 9.6220 gram-force, and in all cases the pull tests resulted in heel breaks in the wire attachments themselves with no lifting, peeling, or delamination of the wire bond.

The use of a palladium layer as a marking material was found by the inventors to achieve superior results relative to other metallization schemes that were tested. For example, the inventors attempted to mark the gold electrical terminal by adding a second, patterned gold film to the terminal to ascertain whether the difference in step height or grain size would provide sufficient contrast between the two gold layers. However, this approach did not produce sufficient contrast to ascertain the marking. The inventors also explored a metallization scheme whereby patterned platinum was deposited on the gold terminal. While this scheme yielded a marking having acceptable contrast while maintaining solderability of the terminal, the resulting marked terminal failed wire bondability tests due to the hardness of the platinum layer. A similar metallization scheme utilizing nickel instead of platinum was also tested and produced similar results. Still another metallization scheme that used titanium as the marking material was tested. While achieving reasonable contrast, this approach was found to weaken the solderability and bondability of the resulting marked terminal.

By layer of palladium, or marking of palladium, it is mean that the layer/marking contain at least 75% by weight palladium. Thus, a palladium layer or marking in accordance with the disclosure herein, includes pure palladium (at least 99.99% by weight palladium), essentially pure palladium (at least 99% by weight palladium), substantially pure palladium (at least 95% by weight palladium), and palladium alloys containing at least 75% by weight palladium. Other metals can be included in the palladium alloys, so long as the palladium alloys retain the main characteristics and properties described above.

Figure 3:
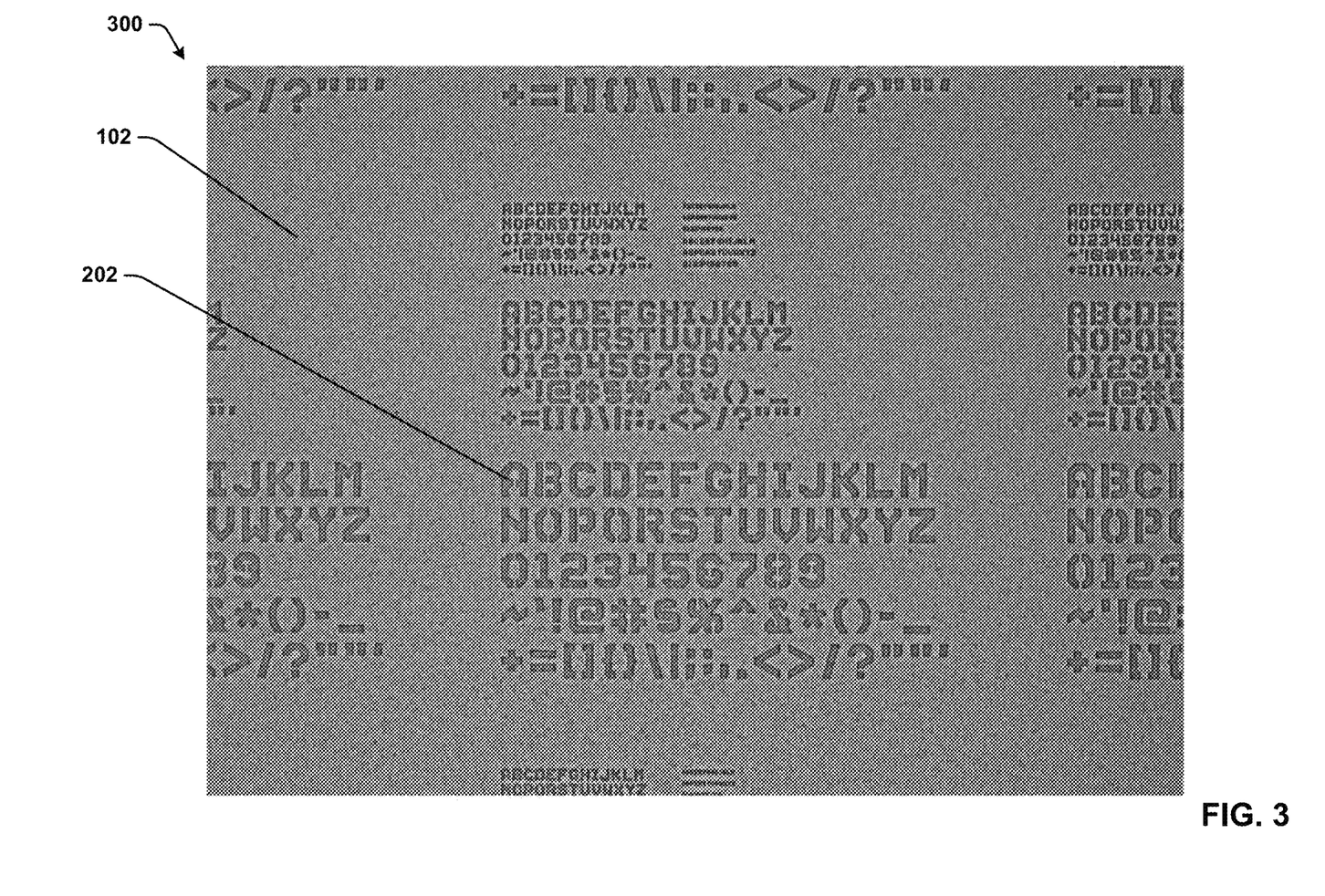
FIG. 3 is an image of a gold metal layer on which alphanumeric markings of various sizes have been deposited as a palladium layer.
Figure 4:
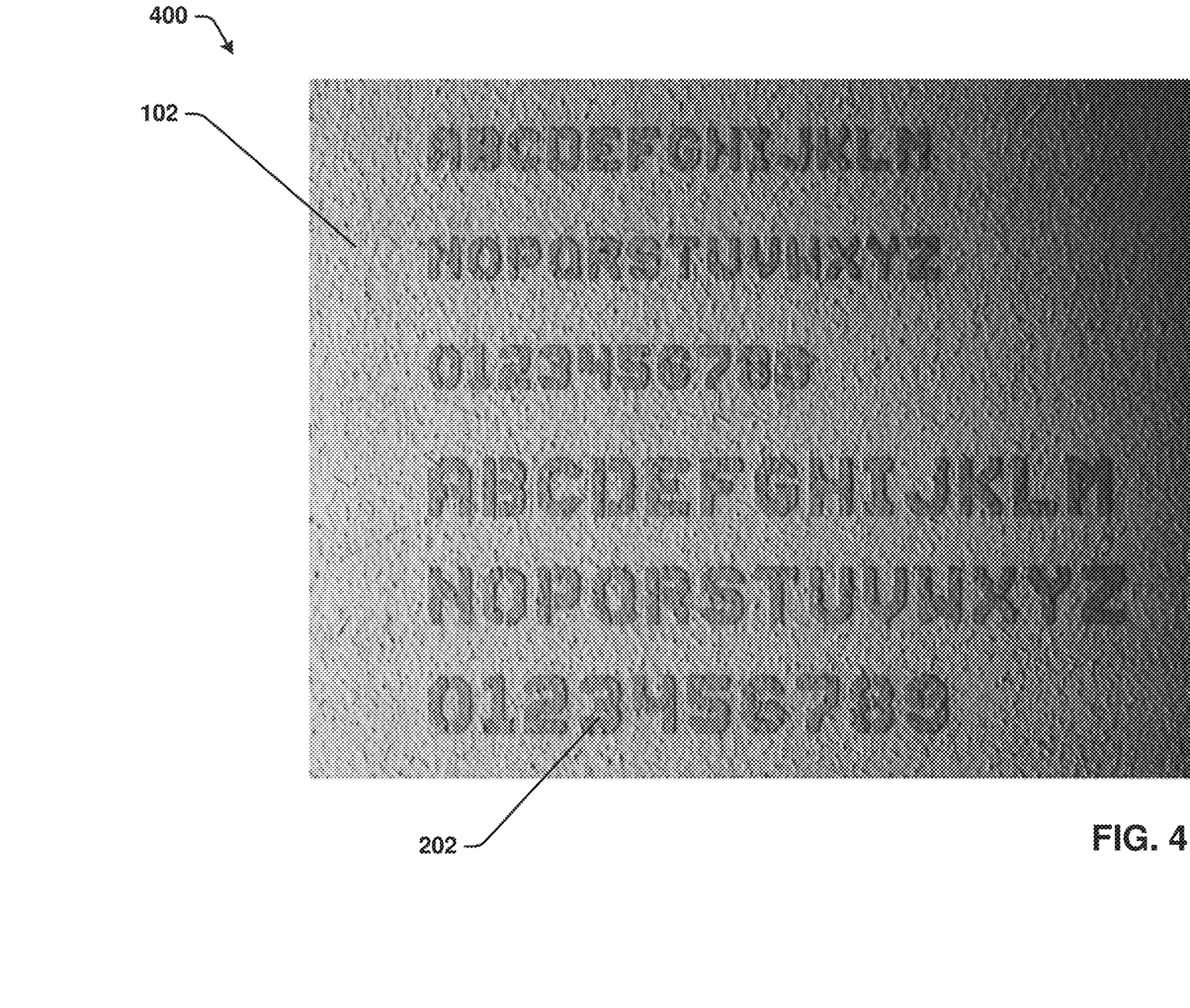
FIG. 4 is another image providing a closer view of the palladium markings.

FIG. 3 is an image 300 of a gold metal layer 202 on which alphanumeric markings 202 of various sizes have been deposited as a palladium layer. FIG. 4 is another image 400 providing a closer view of the palladium markings 202. Palladium markings 202 can comprise one or more symbols, a line of alphanumeric text, or multiple lines of alphanumeric text. Any suitable technique for depositing the palladium marking layer on the device's electrical terminal is within the scope of one or more embodiments of this disclosure, including but not limited to evaporation, lift-off processes, etching, sputtering deposition, plating, or other such deposition processes.

Figure 5:
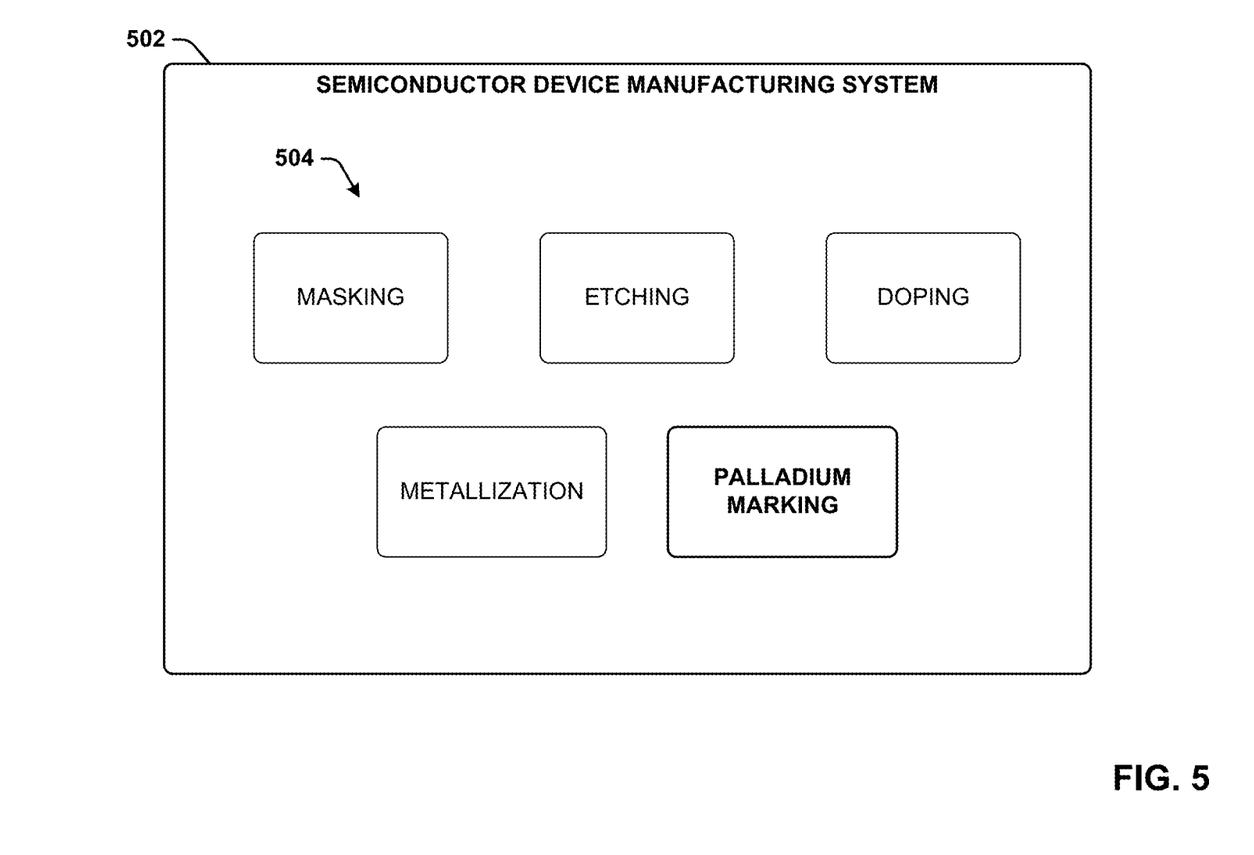
FIG. 5 is a generalized diagram of an example integrated circuit manufacturing system that implements various processes for fabricating semiconductor devices, including a palladium marking process.

FIG. 5 is a generalized diagram of an example semiconductor device manufacturing system 502 that implements various processes 504 for fabricating semiconductor devices, including masking, etching, doping, and metallization processes. As part of the metallization process, the system 502 deposits metal material to form the device's conductive interconnections and electrical terminals (e.g., the top metal layer 102 of the example device 100 depicted in FIG. 1). The metal material can comprise, for example, gold, aluminum, copper, silver, or another metal.

Additionally, the manufacturing system implements a palladium marking process after completion of the metallization process. This palladium marking process deposits a patterned layer or film of palladium on one or more of the metal pads or terminals formed by the metallization process. The palladium marking process can deposit the layer of palladium in a specified pattern corresponding to a desired marking, such as one or more lines of alphanumeric text, one or more symbols, or another type of distinguishable marking.

The use of palladium to mark the final metallic electrical terminals of semiconductor devices as described herein yields a mark with high optical contrast relative to the metallization of the terminal. Also, since this approach does not require removal of metal from the terminal or other such mechanical deformations, the resulting mark does not add parasitic capacitance or parasitic inductance, does not change the device's isolating dielectric design, and does not compromise the terminal's solderability or wire bondability. Since the standoff voltage capability of the device is not impacted, this marking approach is suitable for high voltage semiconductor devices, including devices that support standoff voltages in excess of 1,000 volts.

Figure 6:
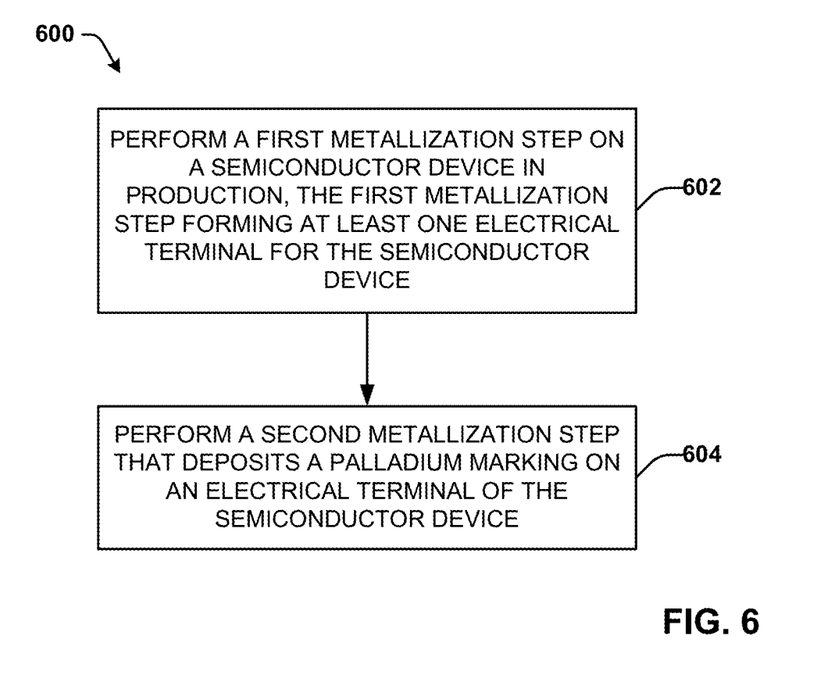
FIG. 6 illustrates a flow diagram of an example, non-limiting method for marking a metal layer of a semiconductor device.

FIG. 6 illustrates a methodology in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 6 is a flow diagram of an example, non-limiting methodology 600 for marking a metal layer of a semiconductor device. Methodology 600 can a sub-process of a more comprehensive manufacturing process for fabricating semiconductor devices. Initially, at 602, a first metallization step is performed on a semiconductor device in production. The first metallization step can comprise depositing a metal material on the device currently being produced to form the conductive interconnections and electrical terminals for the device. The material used for the metallization step can comprise, for example, gold, aluminum, copper, silver, or another suitable metal.

At 604, a second metallization step is performed that deposits a palladium marking on an electrical terminal formed at step 602. The marking can be deposited using any suitable metal deposition technique, including but not limited to evaporation, a lift-off process, etching, sputtering, plating, or other such deposition processes. The palladium can be deposited in a pattern that forms a distinguishable mark or alphanumeric text that can be used to identify the device (or the type of the device) or to convey information about the device. In some embodiments, the second metallization step may deposit the palladium marking on another metal component of the semiconductor device's metallization layer other than an electrical terminal.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A semiconductor device, comprising:
   a terminal comprising a metal pad; and
   a patterned layer of palladium deposited on the terminal, wherein the patterned layer forms one or more lines of alphanumeric text or a symbol on the terminal and provide at least some information describing the semiconductor device, and wherein at least a portion of the terminal is exposed through a gap in the patterned layer of palladium.

2. The semiconductor device of claim 1, wherein the terminal is at least one of gold, copper, silver, or aluminum.

3. The semiconductor device of claim 1, wherein the patterned layer of palladium is deposited on the terminal via at least one of evaporation, a lift-off process, etching, sputtering, or plating.

4. The semiconductor device of claim 1, wherein the semiconductor device is one of a capacitor, a diode, a transistor, a thyristor, a resistor, an inductor, or a filter.

5. The semiconductor device of claim 1, wherein addition of the patterned layer of palladium to the terminal maintains a solderability and a wire bondability of the terminal.

6. The semiconductor device of claim 1, wherein the semiconductor device withstands standoff voltages between components on the semiconductor device of 1,000 volts or more.

7. A semiconductor device manufacturing system that fabricates the semiconductor device of claim 1.

8. The semiconductor device of claim 1, further comprising:
   a silicon substrate;
   a dielectric layer formed on top of the silicon substrate, and wherein the dielectric layer is positioned between the silicon substrate and the metal pad.

9. A semiconductor device, comprising:
   an electrical contact formed by a first metallization process and comprising one or more lines of alphanumeric text or a symbol formed by a layer of palladium deposited on the electrical contact by a second metallization process, wherein the one or more lines of alphanumeric text or the symbol provide at least some information describing the semiconductor device, and wherein at least a portion of the electrical contact is exposed through a gap in the layer of palladium.

10. The semiconductor device of claim 9, wherein the electrical contact is made of at least one of gold, copper, silver, or aluminum.

11. The semiconductor device of claim 9, wherein the second metallization process deposits the layer of palladium on the electrical contact using at least one of evaporation, a lift-off process, etching, sputtering, or plating.

12. The semiconductor device of claim 9, wherein the semiconductor device is one of a capacitor, a diode, a transistor, a thyristor, a resistor, an inductor, or a filter.

13. The semiconductor device of claim 9, wherein addition of the layer of palladium to the electrical contact by the second metallization process maintains a solderability and a wire bondability of the electrical contact.

14. The semiconductor device of claim 9, wherein the semiconductor device supports standoff voltages between components on the semiconductor device of 1,000 volts or more.

15. A semiconductor device manufacturing system that fabricates the semiconductor device of claim 9.

16. The semiconductor device of claim 9, further comprising:
   a silicon substrate;
   a dielectric layer formed on top of the silicon substrate, and wherein the dielectric layer is positioned between the silicon substrate and the electrical contact.

17. A method for marking a semiconductor device, comprising:

performing a first metallization process on a semiconductor device in production that yields at least one electrical terminal on the semiconductor device; and performing a second metallization process that deposits a palladium mark on an electrical terminal of the at least one electrical terminal, wherein the mark comprises one or more lines of alphanumeric text or a symbol and provide at least some information describing the semiconductor device, and wherein at least a portion of the at least one electrical terminal is exposed through a gap in the palladium mark.

18. The method of claim 17, wherein the performing of the first metallization process comprises forming the at least one electrical terminal using at least one of gold, copper, silver, or aluminum.

19. The method of claim 17, wherein the performing of the second metallization process comprises depositing the palladium mark via at least one of evaporation, a lift-off process, etching, sputtering, or plating.

20. The method of claim 17, wherein the performing of the second metallization process comprises depositing the palladium mark on the electrical terminal in a pattern that defines at least one of a symbol, a line of alphanumeric text, or multiple lines of alphanumeric text.

* * * * *